(12) United States Patent
Son et al.

(10) Patent No.: US 8,692,239 B2
(45) Date of Patent: Apr. 8, 2014

(54) ORGANIC LIGHT EMITTING DISPLAY DEVICE

(75) Inventors: Jung Hyun Son, Seoul (KR); Hoon Kim, Hwaseong-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 107 days.

(21) Appl. No.: 13/487,935

(22) Filed: Jun. 4, 2012

(65) Prior Publication Data

US 2013/0087769 A1    Apr. 11, 2013

(30) Foreign Application Priority Data

Oct. 6, 2011    (KR) .......................... 10-2011-0102024

(51) Int. Cl.
*H01L 51/00*    (2006.01)

(52) U.S. Cl.
USPC ............... 257/40; 257/79; 257/59; 257/72; 257/E51.027; 438/99

(58) Field of Classification Search
USPC ............... 257/40, 59, 72, 79, 98, E33.061, 257/E51.027; 438/99
See application file for complete search history.

(56) References Cited

U.S. PATENT DOCUMENTS

| 2011/0057191 A1* | 3/2011 | Murakami | 257/59 |
| 2011/0159622 A1* | 6/2011 | Jeong et al. | 438/34 |
| 2011/0309254 A1* | 12/2011 | Angell et al. | 250/363.01 |

FOREIGN PATENT DOCUMENTS

| JP | 2010-157515 | 7/2010 |
| KR | 10-2005-0101267 | 10/2005 |
| KR | 10-2007-0071784 | 7/2007 |

* cited by examiner

*Primary Examiner* — Thanh V Pham
(74) *Attorney, Agent, or Firm* — Robert E. Bushnell, Esq.

(57) ABSTRACT

An organic light emitting display device which includes a base member; an organic light emitting display unit provided on one surface of the base member and configured to generate an image; an intermediate layer provided over the one surface of the base member and formed to be in contact with the organic light emitting display unit; and a capping member including a bulkhead member and a first member, wherein one surface of the first member is in contact with the intermediate layer, and the bulkhead member is protruded from an opposite surface of the first member to define a plurality of capping areas.

20 Claims, 4 Drawing Sheets

ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 6 Oct. 2011 and there duly assigned Serial No. 10-2011-0102024.

BACKGROUND OF THE INVENTION

1. Field of the Invention

Embodiments relate to an organic light emitting display device, and more particularly, relate to an organic light emitting display device having a capping member.

2. Description of the Related Art

As compared with a liquid crystal display device, an organic light emitting display device using organic light emitting elements may be characterized in that a response speed is faster, a viewing angle is wider due to a spontaneous light emitting property, and luminance is higher. The organic light emitting elements may be formed of two opposite electrodes and a light emitting layer interposed between the two electrodes and including an organic substance.

The organic light emitting elements may be sensitive to moisture. Upon contact with moisture, the organic light emitting elements may be easily degraded. If moisture is diffused into an organic substance layer, an electrochemically charge transfer reaction may be conducted at the interface between a pixel electrode or an opposite electrode and the organic substance layer, so that an oxide is generated. The pixel electrode or opposite electrode and the organic substance layer may be separated by the oxide. This may mean that dark spot is generated. Accordingly, a life of the organic light emitting elements may be shortened.

To solve the above-described problem, a conventional organic light emitting display device may have a capping member for protecting an organic light emitting element from moisture. The conventional organic light emitting display device may have a plate-type capping member or a capping member formed by iteratively stacking an organic substance layer and a nonorganic substance layer.

SUMMARY OF THE INVENTION

One aspect of embodiments of the inventive concept is directed to provide an organic light emitting display device comprising a base member; an organic light emitting display unit provided on one surface of the base member and configured to generate an image; an intermediate layer provided on the one surface of the base member and formed to be in contact with the organic light emitting display unit; and a capping member including a bulkhead member and a first member, wherein one surface of the first member is in contact with the intermediate layer, and the bulkhead member is protruded from the other surface of the first member to define a plurality of capping areas.

In this embodiment, the bulkhead member includes at least three or more bulkheads for defining the plurality of capping areas, each of the capping areas is polygonal on a plane.

In this embodiment, the at least three or more bulkheads have the same height from the other surface of the first member.

In this embodiment, the at least three or more bulkheads have the same length on a plane.

In this embodiment, the bulkhead member includes six bulkheads, and each of the plurality of capping areas has a hexagonal pillar shape.

In this embodiment, the first member is formed of a metal matter.

In this embodiment, the metal matter includes aluminum or aluminum alloy.

In this embodiment, the bulkhead member is integrated with the first member.

In this embodiment, the bulkhead member is formed of the same matter as the first member.

In this embodiment, the capping member further comprises a second member which is opposite to the first member and is coupled with the bulkhead member.

In this embodiment, the second member seals at least a part of the plurality of capping areas.

In this embodiment, the organic light emitting display unit outputs the image into a base member direction.

Another aspect of embodiments of the inventive concept is directed to provide an organic light emitting display device comprising a base member on which a plurality of pixel regions is defined; an organic light emitting element having a first electrode, a second electrode opposite to the first electrode, and an organic light emitting layer interposed between the first electrode and the second electrode, the organic light emitting element being provided at the plurality of pixel regions, respectively; a metal substrate including a first plane portion having one surface opposite to the base member and the other surface opposite to the one surface, and a bulkhead portion being protruded from the other surface of the first plane portion and defining a plurality of capping areas on a plane; and a sealing member provided between the base member and the metal substrate and being in contact with at least a part of the organic light emitting element.

In this embodiment, the organic light emitting display device further comprises a switching element providing a driving voltage to the first electrode, the switching element being provided at the plurality of pixel regions, respectively;

In this embodiment, the bulkhead portion includes at least three or more bulkheads for defining the plurality of capping areas, each of the capping areas is polygonal on a plane.

In this embodiment, the metal substrate includes aluminum or aluminum alloy.

In this embodiment, the metal substrate further comprises a second plane portion which is opposite to the first plane portion and is coupled with the bulkhead portion.

In this embodiment, the second plane portion seals at least a part of the plurality of capping areas.

In this embodiment, the first electrode, the organic light emitting layer, and the second electrode are sequentially stacked from the base member, and the second electrode is a reflective electrode reflecting a light generated from the organic light emitting layer into a base member direction.

In this embodiment, the second electrode of the organic light emitting element provided at each of the plurality of pixel regions is integrated with a second electrode an organic light emitting element provided at an adjacent pixel region.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
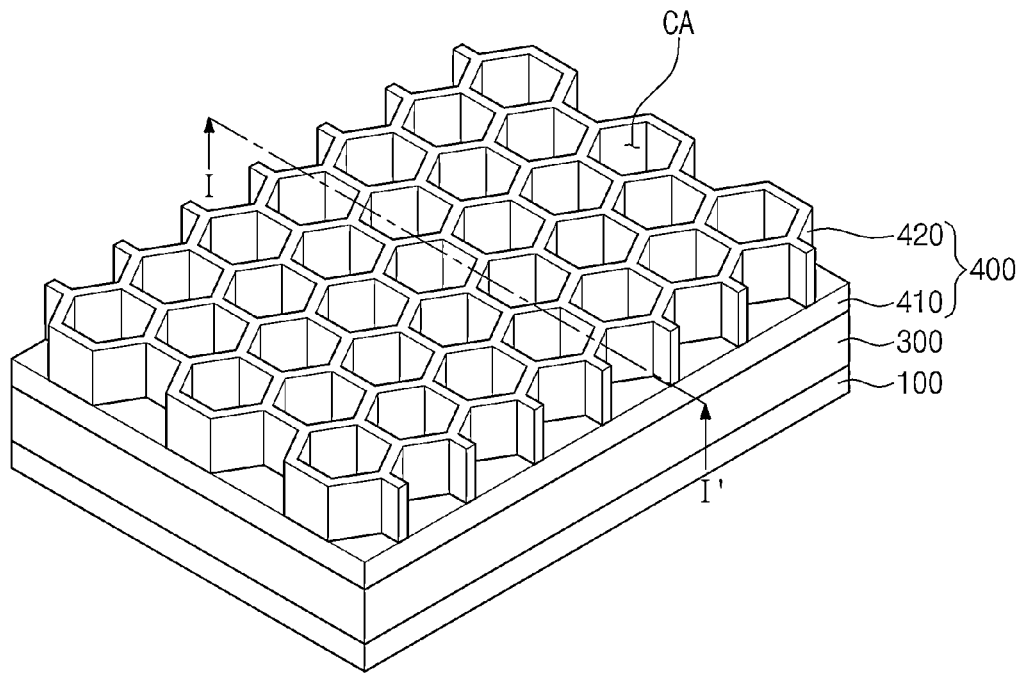
FIG. 1 is a perspective view of an organic light emitting display device according to an embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
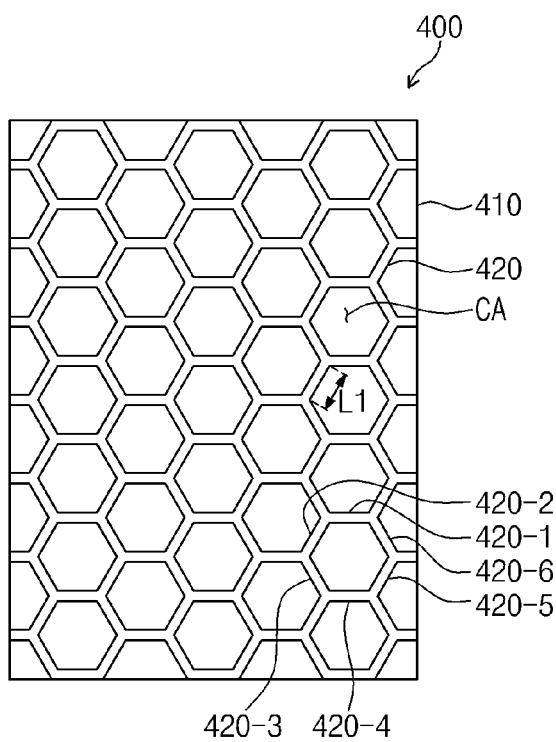
FIG. 2 is a top view of FIG. 1.
Figure 3:
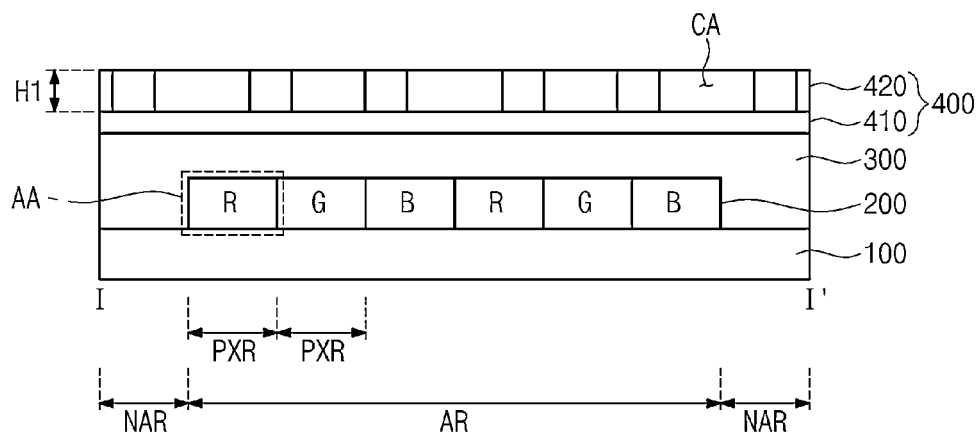
FIG. 3 is a cross-sectional view taken along a line I-I' in FIG. 2.
Figure 4:
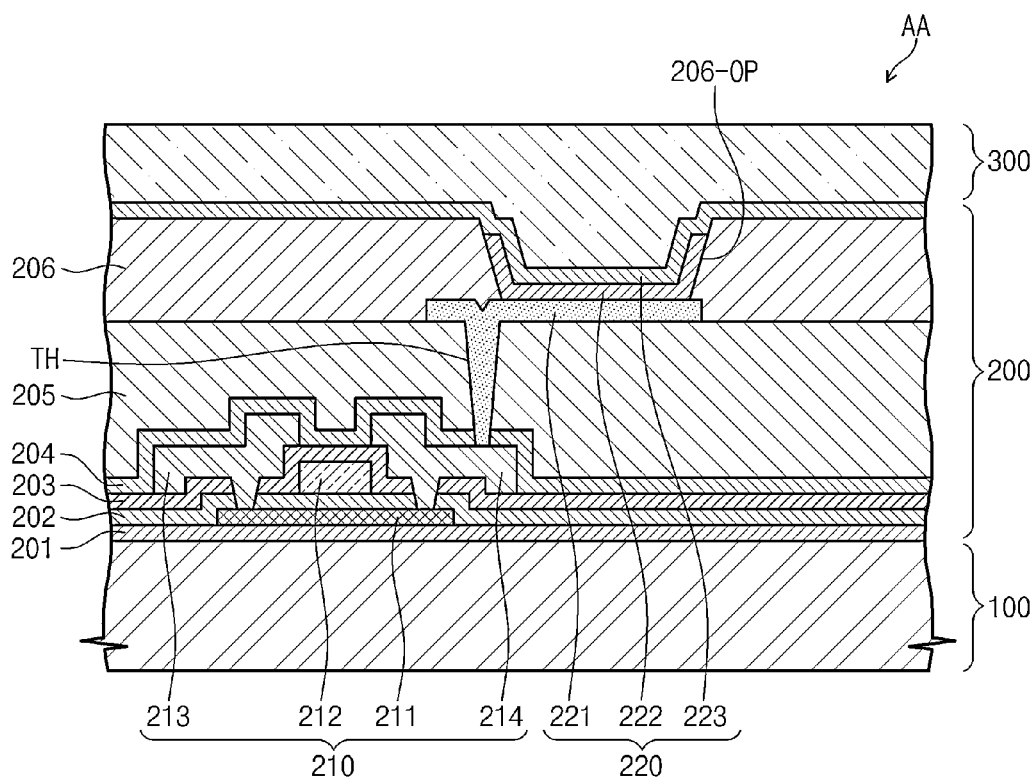
FIG. 4 is an enlarged cross-sectional view of a part of FIG. 3.

FIG. 1 is a perspective view of an organic light emitting display device according to an embodiment of the inventive concept. FIG. 2 is a top view of FIG. 1. FIG. 3 is a cross-sectional view taken along a line I-I' in FIG. 2. FIG. 4 is an enlarged cross-sectional view of a part of FIG. 3.

As illustrated in FIGS. 1 through 4, an organic light emitting display device may include a base member (or, substrate) 100, an organic light emitting display unit 200 (FIGS. 3 and 4), an intermediate layer 300, and a capping member 400.

The base member 100 may include (FIG. 3) a display area AR and a non-display area NAR adjacent to the display area AR. The display area AR may be an area where an aftermentioned organic light emitting display unit 200 is disposed. The display area AR may be divided into a plurality of pixel regions PXR.

The base member 100 can be formed of glass, plastic such as acrylic, and the like. It may be desirable to use a tempered glass or a tempered plastic such as polycarbonate as the base member 100. However, the inventive concept is not limited thereto.

The organic light emitting display unit 200 may be provided on one surface of the base member 100. The organic light emitting display unit 200 may spontaneously emit a light according to the mechanism that negative and positive charges injected via two electrodes are combined within an organic substance.

The organic light emitting display unit 200 may be classified into a passive matrix type and an active matrix type according to whether switching elements are included or not. The organic light emitting display unit 200 according to an embodiment of the inventive concept may be the active matrix type. Below, an active matrix type organic light emitting display unit 200 will be described with reference to FIG. 4.

The organic light emitting display unit 200 may include a switching element 210 provided on the base member 100 and an organic light emitting element 220 connected with the switching element 210. The organic light emitting display unit 200 may further include a plurality of layers 201 through 206 provided on the base member 100. The switching element 210 and the organic light emitting element 220 may be formed at each of the plurality of pixel regions PXR.

For ease of description, one switching element 210 and one organic light emitting element 220 corresponding to one pixel region PXR are illustrated in FIG. 4. In this embodiment, each of the plurality of pixel regions PXR may include such a construction as illustrated in FIG. 4. Adjacent pixel regions PXR may further include different color filters (not shown) to emit lights of different colors.

The switching element 210 may be a thin film transistor. Below, the switching element 210 will be more fully described with reference to FIG. 4.

A buffer layer 201 may be formed on one surface of the base member 100 to level a surface of the base member 100 and to prevent infiltration of impurities. The buffer layer 201 may be formed of silicon oxide ($SiO_x$) or silicon nitride ($SiN_x$). The buffer layer 201 can be removed on a case-by-case basis.

An active layer 211 of the switching element 210 may be formed on the buffer layer 201 using a semiconductor substance. A gate insulation film 202 may be formed on the buffer layer 201 to cover the active layer 211. A gate electrode may be provided on the gate insulation film 202. An interlayer insulation film 203 may be formed on the gate insulation film 202 to cover the gate electrode 212. A source electrode 213 and a drain electrode 214 may be provided on the interlayer insulation film 203. A protection film 204 and a planarization film 205 may be formed sequentially on the interlayer insulation film 203 to cover the source electrode 213 and the drain electrode 214.

The gate insulation film 202, the interlayer insulation film 203, the protection film 204, and the planarization film 205 may be formed of an insulation substance. Alternatively, the gate insulation film 202, the interlayer insulation film 203, the protection film 204, and the planarization film 205 may be formed of a single-layer structure or a multi-layer structure including a non-organic substance, an organic substance, or a compound of the non-organic substance and the organic substance. A stack structure of the switching element 210 may be exemplary, and the inventive concept is not limited thereto. The switching element 210 may provide a driving voltage input from the outside to an after-mentioned organic light emitting element 220.

The organic light emitting element 220 may be provided on the planarization film 205. The organic light emitting element 220 will be more fully described with reference to FIG. 4. The organic light emitting element 220 may include a first electrode 221, an organic light emitting layer 222, and a second electrode 223. The organic light emitting layer 222 may be interposed between the first electrode 221 and the second electrode 223, and the first electrode 221 and the second electrode 223 may be disposed to be opposite to each other.

The first electrode 221 may be formed on the planarization film 205. The first electrode 221 may be an anode electrode. The first electrode 221 may be connected to the drain electrode 214 via a through hole TH formed at the planarization film 205.

A pixel define layer 206 may be formed on the planarization film 205, and may include an opening portion 206-OP formed to expose the first electrode 221. The organic light emitting layer 222 stacked on the first electrode 221 may be formed at the opening portion 206-OP. The second electrode 223 may be provided on the pixel define layer 206 to be connected with the organic light emitting layer 222. The second electrode 223 may be a cathode electrode. The first electrode 221 and the second electrode 223 can be exchanged.

The organic light emitting element 220 may have a bottom emission structure enabling an image to be emitted to a base member side. In this case, the first electrode 221 may be a transparent electrode, and the second electrode 223 may be a reflective electrode reflecting a light generated by the organic light emitting layer 222.

The first electrode 221 may be formed of a transparent metal oxide substance such as indium tin oxide (ITO), indium zinc oxide (IZO), tin oxide ($SnO_2$), and zinc oxide (ZnO). The second electrode 223 may be formed of lithium (Li), magnesium (Mg), aluminum (Al), aluminum-lithium (Al—Li), calcium (Ca), magnesium-indium (Mg—In), magnesium-Argentum (Mg—Ag), and a compound thereof.

The organic light emitting layer 222 may be formed of an organic small molecular substance or an organic polymer substance. The organic small molecular substance may include copper phthalocyanine (CuPc), N, N-di(naphfhalene-1-yl)-N, N'-di(naphthalene-1-yl)-N, N'-diphenyl-benzidine (NPB), tris-8-hydroxyquinoline aluminum (Alq3), and the like.

The organic polymer substance may include a Poly-Phenylenevinylene polymer and a Polyfluorene polymer.

Although not shown in FIG. 4, other than the organic light emitting layer 222, a hole injection layer, a hole carrier layer, a hole stop layer, an electron carrier layer, an electron injection layer, or one or more layers selected therefrom may be further included between the first electrode 221 and the second electrode 223.

The intermediate layer 300 may be disposed on one surface of the base member 100. As illustrated in FIG. 3, the intermediate layer 300 may be in contact with at least a part of the organic light emitting display unit 200. As illustrated in FIG. 4, the intermediate layer 300 can be in contact with the second electrode 223. It may be desirable to form the intermediate layer 300 so as to cap the organic light emitting display unit 200.

Upon fabrication of the display device, the intermediate layer 300 may be provided on the organic light emitting display unit 200 to have a sheet shape. However, the inventive concept is not limited thereto. The intermediate layer 300 can be formed by coating a capping member of a rich viscosity on the one surface of the base member 100.

The intermediate layer 300 may include thermosetting resin or UV resin (photopolymer).

Epoxy resin can be used as the thermosetting resin. For example, the epoxy resin may be bisphenol-A epoxy resin, bisphenol-F epoxy resin, cycloaliphatic epoxy resin, hydrogenated bisphenol epoxy resin, aromatic epoxy resin, Novolac epoxy resin, dicyclopentadiene epoxy resin, or the like.

The intermediate layer 300 including the thermosetting resin may further comprise heat curing agent, hardening accelerant, antioxidant, coupling agent, etc.

The aromatic epoxy resin or the cycloaliphatic epoxy resin may be used as the UV resin.

The intermediate layer 300 including the UV resin may further comprise photoinitiator, inorganic filler, photoacid generator, coupling agent, space, etc.

Further, the intermediate layer 300 may further include a moisture absorbent or an absorbent. The moisture absorbent or the absorbent may be used to prevent moisture from being infiltrated into the organic light emitting display unit 200 from the outside.

Capping member 400 may be mounted to be opposite to the base member 100.

The capping member 400 may include a first member 410 one surface of which is in contact with the intermediate layer 300 and a bulkhead member 420 which is protruded from the other surface of the first member 410 to define a plurality of capping areas CA on a plane.

The first member 410 may be a plane member, and may cap the organic light emitting display unit 200 by connection with the intermediate layer 300.

The bulkhead member 420 may include at least three or more bulkheads for defining one capping area CA. In this case, adjacent capping areas CA may share the same bulkhead.

Figure 5:
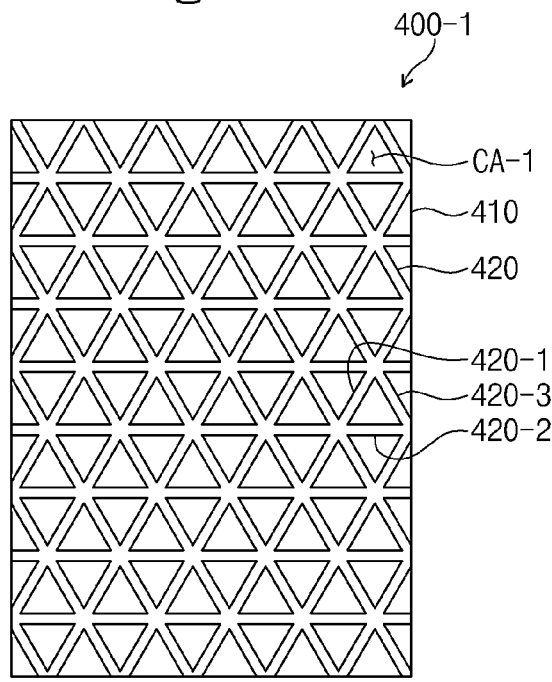
FIGS. 5 and 6 are top views of organic light emitting display devices according to other embodiments of the inventive concept.
Figure 6:
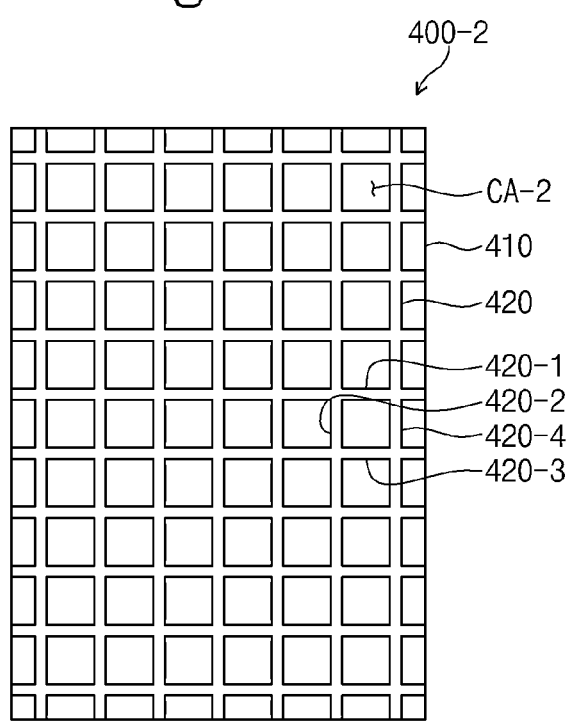

A bulkhead member 420 including six bulkheads 420-1 through 420-6 is exemplarily illustrated in FIGS. 1 and 2. However, the number of bulkheads for defining the capping area CA may not be limited thereto. For example, capping members 400-1 and 400-2 included in an organic light emitting display device according to another embodiment of the inventive concept can be implemented to include a capping area CA-1 defined by three bulkheads 420-1 through 420-3 as illustrated in FIG. 5, or to include a capping area CA-2 defined by four bulkheads 420-1 through 420-4 as illustrated in FIG. 6.

Each of the capping areas CA may be polygonal on a plane. As illustrated in FIGS. 1 and 2, in the event that each of the capping areas CA is defined by six bulkheads 420-1 through 420-6, each of the capping areas CA may be hexagonal on a plane. A plane shape of the capping area CA may be changed according to the number of bulkheads.

The six bulkheads 420-1 through 420-6 may have the same length L1 on a plane. In this case, each of the capping areas CA may be formed to have a hexagonal pillar shape. Further, the six bulkheads 420-1 through 420-6 may have the same height H1.

As the capping areas CA having the same shape are formed by the bulkheads 420-1 through 420-6, the capping areas CA may be uniformly arranged on the first member 410, so that the strength of the capping member 400 is improved.

The capping areas CA need not be formed to have the same shape. For example, the capping member 400 can simultaneously include capping areas CA defined by six bulkheads 420-1 through 420-6 as illustrated in FIG. 2, capping areas CA-1 defined by three bulkheads 420-1 through 420-3 as illustrated in FIG. 5, and capping areas CA-2 defined by four bulkheads 420-1 through 420-4 as illustrated in FIG. 6.

The first member 410 may be formed of a metal having a heat transfer rate higher than other substances. In this case, heat generated from the organic light emitting display unit 200 may be emitted efficiently. For example, the first member 410 may include aluminum, stainless steel, invar (FeNi36 or 64FeNi), magnesium, or one or more metal matters selected therefrom.

It may be desirable to form the first member 410 using such aluminum or aluminum alloy that a heat transmission rate is high, corrosion resistance is good, and a shape is easily modified, The bulkhead member 420 may be formed by the same metal matter as the first member 410.

The bulkhead member 420 may be integrated with the first member 410. In this case, the capping member 400 can be formed using a mold. In the event that the bulkhead member 420 is integrated with the first member 410, the first member 410 may be defined as a first plane portion, and the bulkhead member 420 may be defined as a bulkhead portion.

Figure 7:
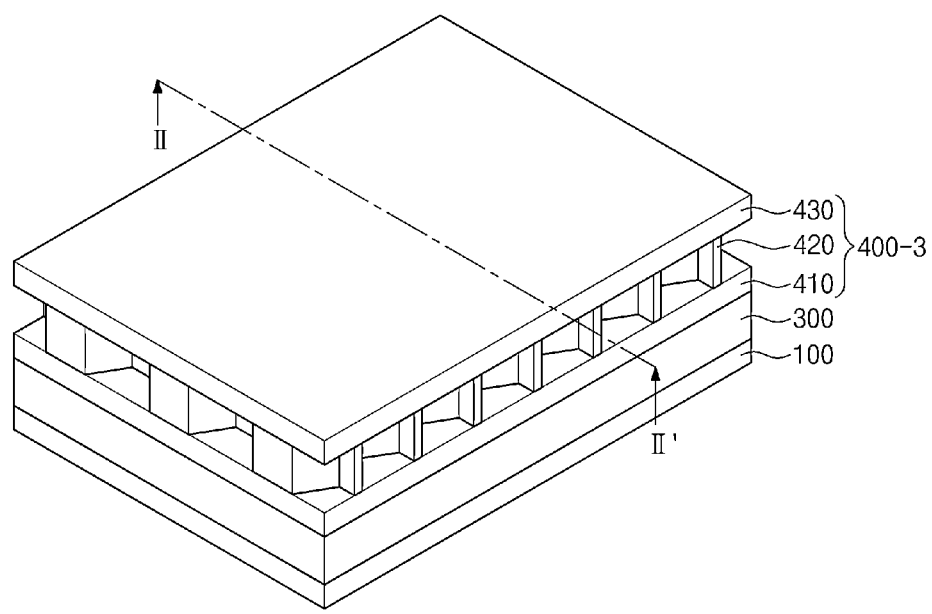
FIG. 7 is a perspective view of an organic light emitting display device according to still another embodiment of the inventive concept.
Figure 8:
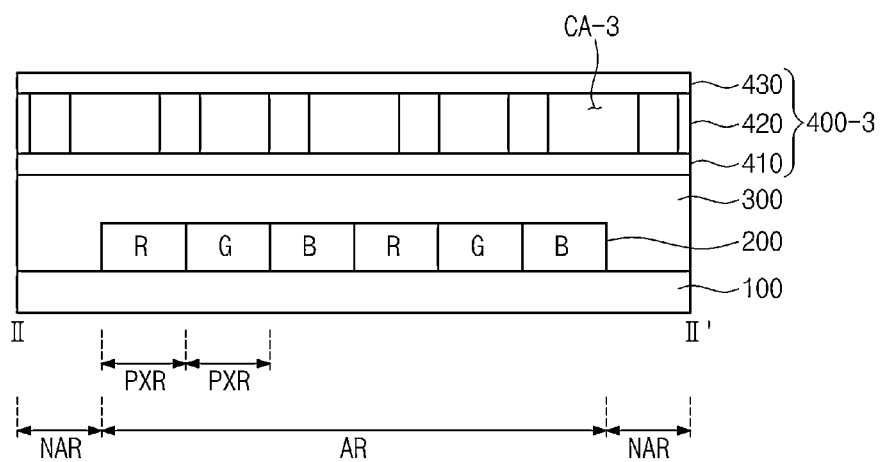
FIG. 8 is a cross-sectional view taken along a line II-II' of FIG. 7.

FIG. 7 is a perspective view of an organic light emitting display device according to still another embodiment of the inventive concept. FIG. 8 is a cross-sectional view taken along a line II-II' of FIG. 7. In FIGS. 7 and 8, constituent elements which are substantially identical to those in FIGS. 1 through 6 may be marked by the same reference numerals, and description thereof is thus omitted.

An organic light emitting display device according to still another embodiment of the inventive concept may further include a capping member 400-3 which further includes a second member 430. The second member 430 may be opposite to a first member 410, and may be coupled with a bulkhead member 420. The second member 430 may be coupled with one end of the bulkhead member 420.

The bulkhead member 420 may be integrated with the first member 410 or with the second member 430.

In the event that the bulkhead member 420 is integrated with the second member 430, a capping member 400-3 may be formed by connecting the bulkhead member 420 with the first member 410.

The second member 430 may be formed of the same matter as the first member 410 or the bulkhead member 420.

The second member 430 may seal the capping area CA-3 defined by the bulkhead member 420. In this case, bulkheads included in the bulkhead member 420 may have the same height.

Other bulkheads (not shown) defining other capping areas and another member provided on the other bulkheads can be iteratively formed on the second member 430.

With an organic light emitting display device according to an embodiment of the inventive concept, it is possible to improve the strength of the display device and a radiation characteristic. Accordingly, it is possible to remove a radiation sheet included in a conventional organic light emitting display device. Further, it is possible to efficiently prevent moisture from be infiltrated into an organic light emitting layer.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An organic light emitting display device comprising:
a base member;
an organic light emitting display unit provided on one surface of the base member and configured to generate an image;
an intermediate layer disposed on the one surface of the base member and formed to be in contact with the organic light emitting display unit; and
a capping member including a bulkhead member and a first member, one surface of the first member being in contact with the intermediate layer, and the bulkhead member is protruded from an opposite surface of the first member to define a plurality of capping areas.

2. The organic light emitting display device of claim 1, wherein the bulkhead member includes at least three or more bulkheads for defining the plurality of capping areas, each of the capping areas is polygonal on a plane.

3. The organic light emitting display device of claim 2, wherein the at least three or more bulkheads have substantially the same height.

4. The organic light emitting display device of claim 3, wherein the at least three or more bulkheads have the same length.

5. The organic light emitting display device of claim 4, wherein the bulkhead member includes six bulkheads, and each of the plurality of capping areas has a hexagonal pillar shape.

6. The organic light emitting display device of claim 1, wherein the first member is formed of a metal matter.

7. The organic light emitting display device of claim 6, wherein the metal matter includes aluminum or aluminum alloy.

8. The organic light emitting display device of claim 6, wherein the bulkhead member is integrated with the first member.

9. The organic light emitting display device of claim 6, wherein the bulkhead member is formed of the same matter as the first member.

10. The organic light emitting display device of claim 1, wherein the capping member further comprises a second member which is opposite to the first member and is coupled with the bulkhead member.

11. The organic light emitting display device of claim 10, wherein the second member seals at least a part of the plurality of capping areas.

12. The organic light emitting display device of claim 1, wherein the organic light emitting display unit outputs the image into a base member direction.

13. An organic light emitting display device comprising:
   a base member on which a plurality of pixel regions is defined;
   an organic light emitting element having a first electrode, a second electrode opposite to the first electrode, and an organic light emitting layer interposed between the first electrode and the second electrode, the organic light emitting element being provided at the plurality of pixel regions, respectively;
   a metal substrate including a first plane portion having one surface opposite to the base member and the other surface opposite to the one surface, and a bulkhead portion being protruded from the other surface of the first plane portion and defining a plurality of capping areas on a plane; and
   a sealing member provided between the base member and the metal substrate and being in contact with at least a part of the organic light emitting element.

14. The organic light emitting display device of claim 13, further comprising:
   a switching element providing a driving voltage to the first electrode, the switching element being provided at the plurality of pixel regions, respectively.

15. The organic light emitting display device of claim 14, wherein the bulkhead portion includes at least three or more bulkheads for defining the plurality of capping areas, each of the capping areas is polygonal on a plane.

16. The organic light emitting display device of claim 15, wherein the metal substrate includes aluminum or aluminum alloy.

17. The organic light emitting display device of claim 13, wherein the metal substrate further comprises a second plane portion which is opposite to the first plane portion and is coupled with the bulkhead portion.

18. The organic light emitting display device of claim 17, wherein the second plane portion seals at least a part of the plurality of capping areas.

19. The organic light emitting display device of claim 13, wherein the first electrode, the organic light emitting layer, and the second electrode are sequentially stacked from the base member, and the second electrode is a reflective electrode reflecting a light generated from the organic light emitting layer into a base member direction.

20. The organic light emitting display device of claim 19, wherein the second electrode of the organic light emitting element provided at each of the plurality of pixel regions is integrated with a second electrode an organic light emitting element provided at an adjacent pixel region.

* * * * *